United States Patent
Ban et al.

(10) Patent No.: US 7,550,384 B2
(45) Date of Patent: Jun. 23, 2009

(54) SEMICONDUCTOR DEVICE AND METHOD FOR FORMING PATTERN IN THE SAME

(75) Inventors: Keun Do Ban, Gyeonggi-do (KR); Cheol Kyu Bok, Gyeonngi-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/760,090

(22) Filed: Jun. 8, 2007

(65) Prior Publication Data
US 2008/0160767 A1 Jul. 3, 2008

(30) Foreign Application Priority Data
Dec. 28, 2006 (KR) .................. 10-2006-0137008

(51) Int. Cl.
*H01L 21/44* (2006.01)
(52) U.S. Cl. .................. 438/671; 438/739; 438/771
(58) Field of Classification Search .................. 438/377, 438/555, 444–445, 671, 736–739
See application file for complete search history.

(56) References Cited
U.S. PATENT DOCUMENTS
2002/0096490 A1 7/2002 Yu .............................. 216/41

2006/0068547 A1* 3/2006 Lee et al. .................. 438/257
2007/0077748 A1* 4/2007 Olligs et al. ................ 438/618
2008/0017889 A1* 1/2008 Koh et al. ................... 257/211

FOREIGN PATENT DOCUMENTS
KR 10-1996-0042911 12/1996
KR 10-2004-0019652 3/2004

* cited by examiner

*Primary Examiner*—Dung A. Le
(74) *Attorney, Agent, or Firm*—Marshall, Gerstein & Borun LLP

(57) ABSTRACT

A method for forming a fine pattern of a semiconductor device includes forming a first hard mask layer over a semiconductor substrate and a second hard mask layer over the first hard mask layer, selectively etching the second hard mask layer and the first hard mask layer by using a line/space mask as an etching mask to form a second hard mask layer pattern and a first hard mask layer pattern, forming an insulating film filling the second hard mask layer pattern and the first hard mask layer pattern, selectively etching the second hard mask layer and its underlying first hard mask layer pattern by using the insulating film as an etching mask to form a fourth hard mask layer pattern overlying a third hard mask layer pattern, removing the insulating film and the fourth hard mask layer pattern, and patterning the semiconductor substrate by using the third hard mask layer pattern as an etching mask, to form a fine pattern.

22 Claims, 6 Drawing Sheets

SEMICONDUCTOR DEVICE AND METHOD FOR FORMING PATTERN IN THE SAME

CROSS-REFERENCES TO RELATED APPLICATIONS

The present application claims priority to Korean patent application number 10-2006-0137008, filed on Dec. 28, 2006, which is incorporated by reference in its entirety.

BACKGROUND OF THE INVENTION

The present invention relates to a memory device. More particularly, the present invention relates to a method for forming a pattern in a semiconductor device by employing a self-aligned double exposure technology.

In general, a semiconductor device such as dynamic random access memory ("DRAM") includes numerous fine patterns. Such patterns are formed through a photolithography process. In order to form a pattern by a photolithography process, a photoresist ("PR") film is coated over a target layer to be patterned. Next, an exposure process is performed to change solubility in a given potion of the PR film. Subsequently, a developing process is performed to form a PR pattern exposing the target layer. That is, the PR pattern is formed by removing the portion of which the solubility is changed, or by removing the portion of which the solubility is not changed. Later, the exposed target layer is etched using the PR pattern, and then the PR pattern is stripped to form a target layer pattern.

In the photolithography process, resolution and depth of focus ("DOF") are two important issues. Resolution (R) can be expressed by Equation 1 below.

$$R = k_1 \frac{\lambda}{NA}, \quad (1)$$

wherein $k_1$ is a constant determined by a kind and thicknesses of PR film, $\lambda$ is a wavelength of light source, and NA stands for a numerical aperture of exposure equipment.

According to the above Equation 1, the shorter the wavelength ($\lambda$) of a light source is and the larger the NA of exposure equipment is, the finer is a pattern formed over a wafer. However, $\lambda$ of a light source being used and the NA of exposure equipment have not kept abreast of recently rapid advances in integration of a semiconductor device. Therefore, resolution enhancement technology ("RET") for improving resolution and DOF is being applied by incorporating diverse methods. For example, the RET technology includes phase shift mask ("PSM"), off-axis illumination ("OAI"), optical proximity correction ("OPC") and the like. Besides, there is a technology called double exposure technique ("DET") capable of forming a fine pattern over a wafer. Critical Dimension (CD) uniformity in the DET depends on overall overlay accuracy of a first exposure mask and a second exposure mask.

However, it is difficult to control the overlay of the first and second exposure masks to fall within the error range. Moreover, technical difficulties make it hard to achieve improvement of exposure equipment.

BRIEF SUMMARY OF THE INVENTION

Embodiments of the present invention are directed to an improved method for forming a pattern in a semiconductor device. According to one embodiment of the present invention, the improved method for forming a pattern in a semiconductor device utilizes a self-aligned double exposure technology.

According to an embodiment of the present invention, a method for forming a pattern in a semiconductor device includes: forming a stacked structure of a first hard mask layer over a semiconductor substrate and a second hard mask layer over the first hard mask layer, selectively etching the second hard mask layer and the first hard mask layer by using a line/space mask as an etching mask to form a second hard mask layer pattern and a first hard mask layer pattern, wherein a line width of an upper part of the second hard mask layer pattern is narrower than that of its lower part, forming an insulating film filling the second hard mask layer pattern and the first hard mask layer pattern, selectively etching the second hard mask layer and its underlying first hard mask layer pattern by using the insulating film as an etching mask to form a third hard mask layer pattern over a fourth hard mask layer pattern, removing the insulating film and the third hard mask layer pattern, and patterning the semiconductor substrate by using the fourth hard mask layer pattern as an etching mask to form a fine pattern.

According to another embodiment, a semiconductor device has fine patterns that are formed according to the method for forming a pattern described herein.

DESCRIPTION OF EMBODIMENTS

Figure 1A:
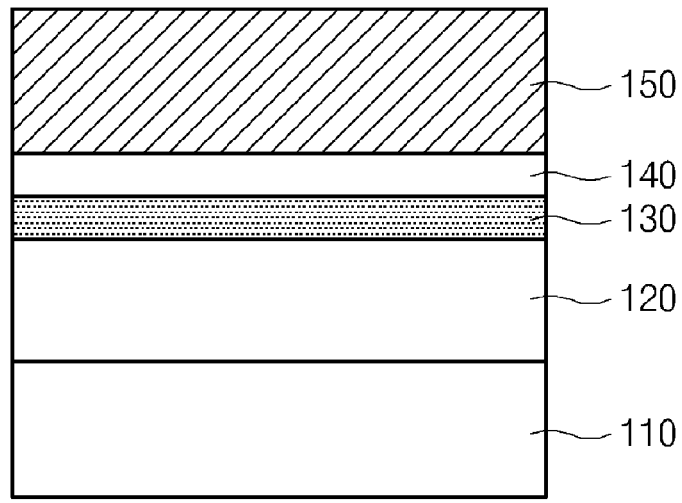
FIGS. 1a to 1k are cross-sectional views illustrating a method for forming a pattern in a semiconductor device according to an embodiment of the present invention.
Figure 1B:
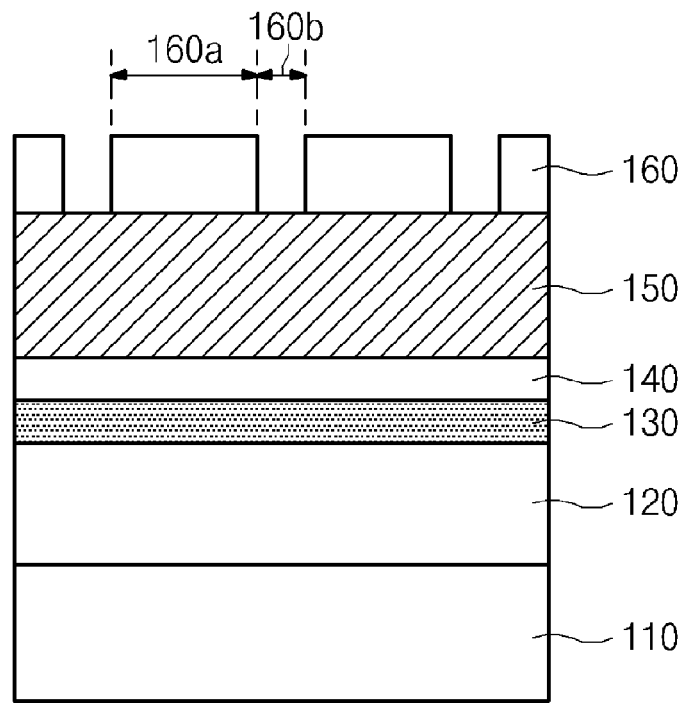
Figure 1C:
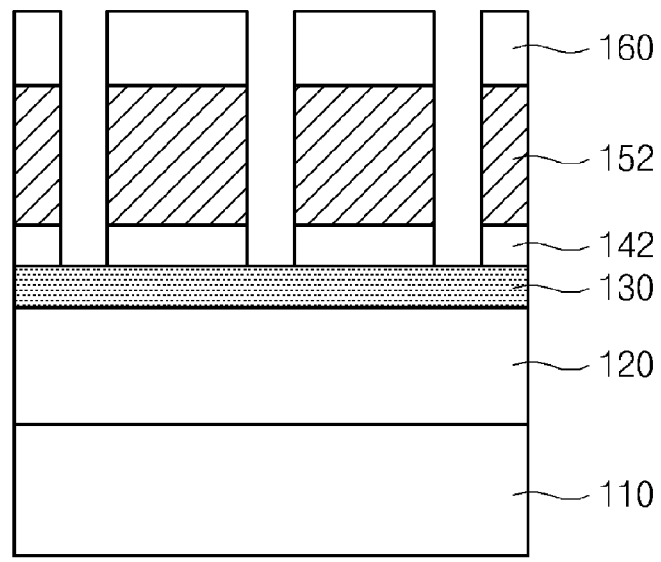
Figure 1D:
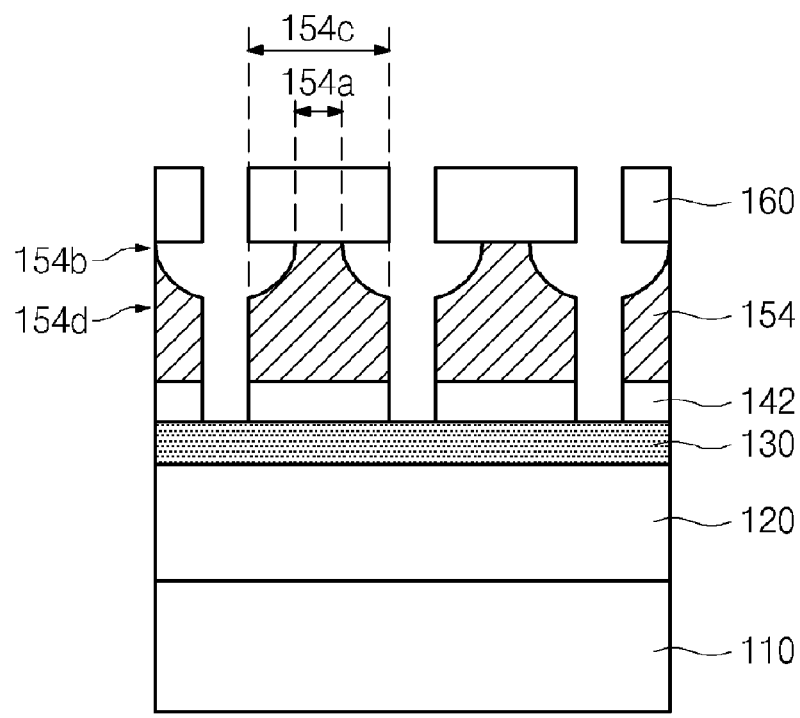
Figure 1E:
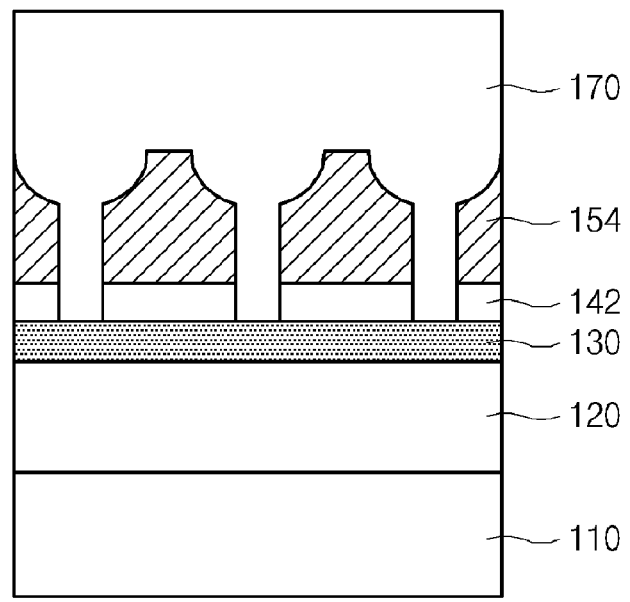

The present invention relates to a semiconductor device with fine patterns that are formed on the basis of a self-aligned double exposure technique. The fine patterns are realized with one exposure mask by using a modified stacked structure of hard mask layers and an isotropic etching method. Such fine patterns are uniformly formed to improve the degree of the integration and yield of semiconductor devices. According to the improved method for forming a fine pattern, the fabrication process of a semiconductor device is also simplified to reduce processing costs.

FIGS. 1a to 1k are cross-sectional views illustrating a method for forming a pattern in a semiconductor device according to an embodiment of the present invention. A first hard mask layer 120, a second hard mask layer 130, a third hard mask layer 140, and a fourth hard mask layer 150 are formed over a semiconductor substrate 110 having an etch-target layer (not shown). A photoresist film (not shown) is formed over the fourth hard mask layer 150. The photoresist film is exposed and developed using a line/space mask (not shown) to form a photoresist pattern 160. The fourth hard mask layer 150 and the third hard mask layer 140 are selectively etched using the photoresist pattern 160 as an etching mask to form a first hard mask layer pattern 152 and a second hard mask layer pattern 142.

According to one embodiment of the invention, the first hard mask layer 120 is formed of an amorphous carbon film; the second hard mask layer 130 is formed of a silicon oxynitride (SiON) film; the third hard mask layer 140 is formed of a polysilicon layer or a silicon nitride ($Si_3N_4$) film; and the fourth hard mask layer 150 is formed of a silicon oxide ($SiO_2$) film. In another embodiment, a ratio of the line width 160a of the photoresist pattern 160 to the width of the space 160b defined between the neighboring photoresist patterns 160 is in a range of about 2.5:1.5 to about 3.5:0.5. In addition, the ratio of the line width 160b to the width of the space 160a is preferably substantially about 3:1. In another embodiment of the present invention, the process of selectively etching the fourth hard mask layer 150 and the third hard mask layer 140 is performed by an anisotropic dry etching method.

Figure 1F:
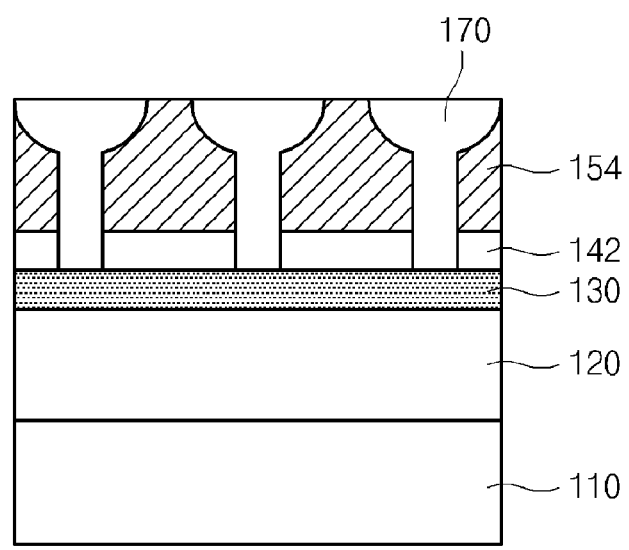

Referring to FIGS. 1c through 1f, the first hard mask layer pattern 152 is selectively etched by using the photoresist pattern 160 as an etching mask to form a third hard mask layer pattern 154. The photoresist pattern 160 is then removed. An insulating film 170 is formed over the semiconductor substrate 110 to fill the second hard mask layer pattern 142 and the third hard mask layer pattern 154. The insulating film 170 is etched until the top surface of the third hard mask layer pattern 154 is exposed (FIG. 1f).

According to one embodiment of the present invention, the third hard mask layer pattern 154 is formed by an isotropic wet etching method. In addition, the isotropic etching method may be adjusted so that a latitudinal line width 154a of an upper part (for example 154b) of the third hard mask layer pattern 154 is substantially equal to that of the space 160b defined between the neighboring photoresist patterns 160 shown in FIG. 1b (see also FIG. 1d). In another embodiment of the present invention, a ratio of the line width 154a of the upper part (for example 154b) of the third hard mask layer pattern 154 to the width 154c of the lower part (for example 154d) is in a range of about 1.5:2.5 to about 0.5:3.5. In addition, the ratio of the line width 154a to the width 154c is substantially about 1:3. In another embodiment of the present invention, the insulating film 170 is formed of a spin-on-carbon ("SOC") film so that the third hard mask layer pattern 154 which upper part is etched wider than its lower part is filled. In addition, the etching process of etching the insulating film 170 preferably is performed by an etch-back method using a gas including $O_2$.

Figure 1G:
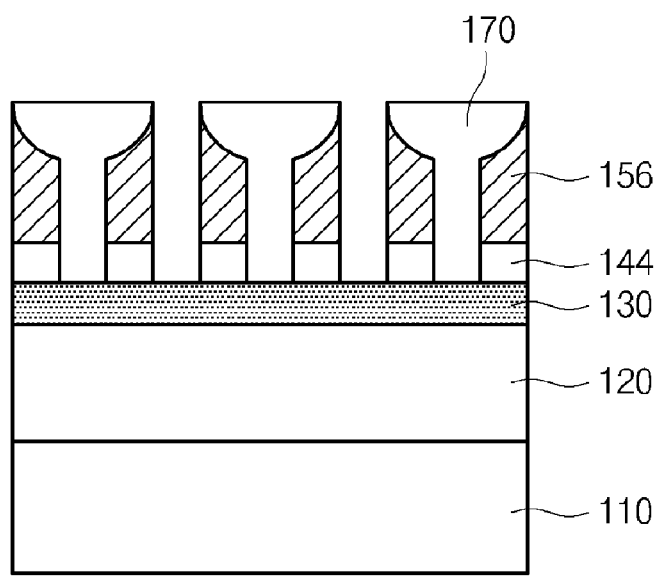
Figure 1H:
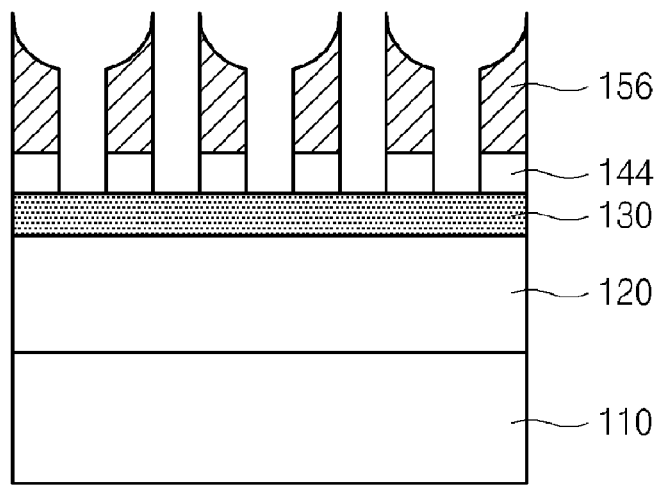
Figure 1I:
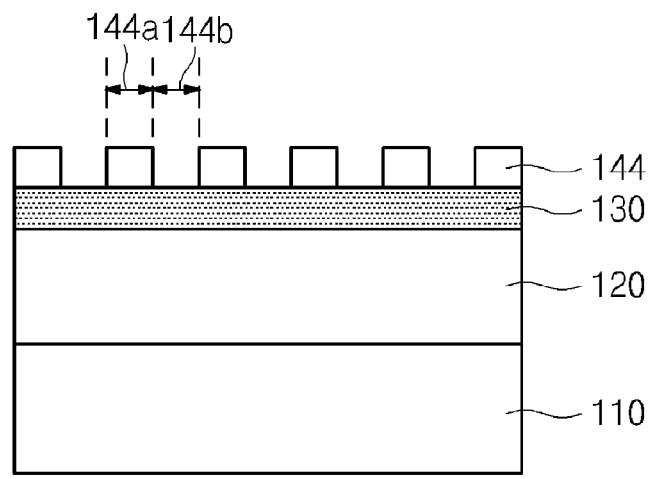

Referring to FIGS. 1g to 1i, the exposed third hard mask layer pattern 154 and its underlying second hard mask layer pattern 142 are selectively etched using the insulating film 170 as an etching mask to form a fourth hard mask layer pattern 156 and a fifth hard mask layer pattern 144, which exposes the second hard mask layer 130 (FIG. 1g). The insulating film 170 is removed. The fourth hard mask layer pattern 156 is removed (FIG. 1i).

According to one embodiment of the present invention, the process of etching the third hard mask layer pattern 154 and the second hard mask layer pattern 142 is performed by an anisotropic dry etching method. The process of removing the insulating film 170 preferably is performed by a plasma etching method using a gas including $O_2$. In addition, the second hard mask layer 130, which is considered as a buffer layer, formed of a silicon oxynitride (SiON) film can serve as an etch stop film during a plasma etching method to prevent the first hard mask layer 120 from being etched.

In another embodiment of the present invention, the process of removing the fourth hard mask layer pattern 156 is performed by a wet etching method using a buffer oxide etchant ("BOE") solution. In the wet etching method using the BOE solution, the fifth hard mask layer pattern 144 and the second hard mask layer 130 are not etched so that a fourth hard mask layer pattern 156 that is formed of a silicon oxide ($SiO_2$) film can be selectively removed. In another embodiment of the present invention, a ratio of a latitudinal line width 144a of the fifth hard mask layer pattern 144 to the width of the space 144b defined between the neighboring fifth hard mask layer patterns 144 is substantially about 1:1 (See FIG. 1i). For example, the line width of each of two pattern elements will be about equal to the width of the space between them.

Figure 1J:
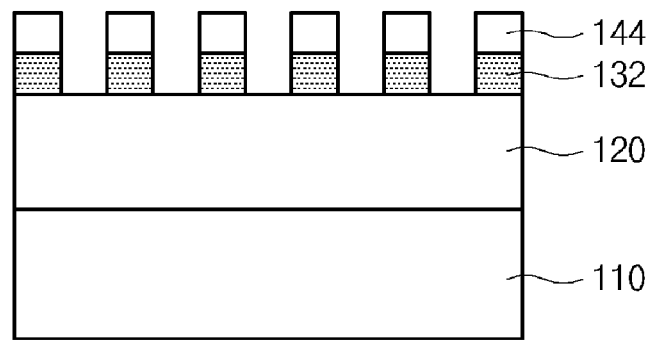
Figure 1K:
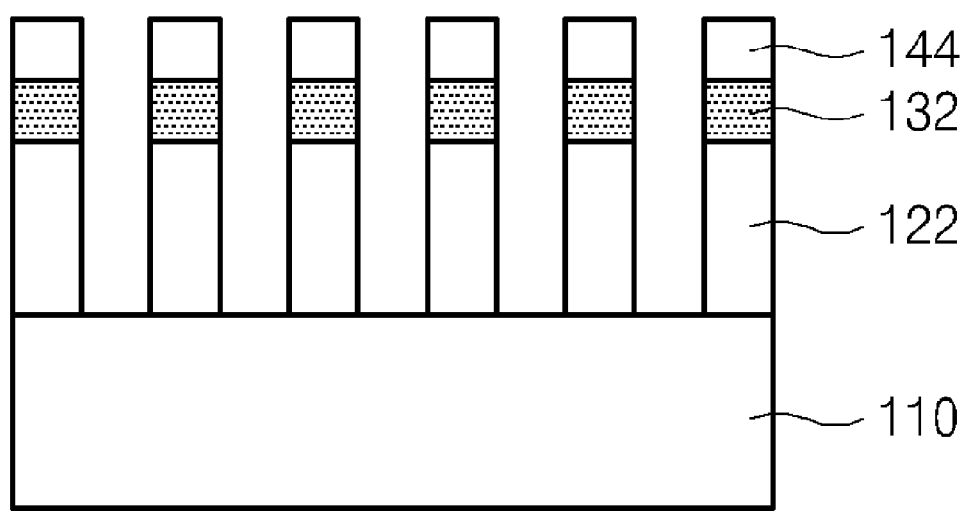

Referring to FIGS. 1j and 1k, the second hard mask layer 130 is etched using the fifth hard mask layer pattern 144 as an etching mask to form a sixth hard mask layer pattern 132. The first hard mask layer 120 is etched using the sixth hard mask layer pattern 132 to form a seventh hard mask layer pattern 122. The etch target layer is patterned using the seventh hard mask layer pattern 122 to form a fine pattern. Accordingly, a fine pattern can be formed in a semiconductor device based on the self-aligned double exposure technology having one mask process.

As described above, according to the semiconductor device and the pattern formation method for the same, it becomes possible to form a fine pattern having uniform critical dimension, irrespective of the overlay accuracy of exposure equipment. Accordingly, the integration and yield of semiconductor devices are improved. Moreover, since the double exposure technique uses one exposure mask, the overall fine pattern formation process is simplified to reduce processing costs.

The above embodiments of the present invention are illustrative and not limitative. Throughout the specification, where methods and compositions are described as including steps or materials, it is contemplated that the methods and compositions can also consist essentially of, or consist of, any combination of the recited steps or materials, unless described otherwise. Although processes have been described with reference to particular embodiments, a person of ordinary skill in the art will readily appreciate that various alternatives and equivalents are possible. Other additions, subtractions, or modifications will be obvious to a person of ordinary skill in the art in view of the present disclosure and are intended to fall within the scope of the appended claims. The invention is not limited by the lithography steps or materials described herein, nor is the invention limited to any specific type of semiconductor device. For example, the present invention may be implemented in a dynamic random access memory (DRAM) device or non volatile memory device. The order of steps may be changed without departing from the scope or spirit of the method, unless described otherwise. In addition, individual steps may be combined, omitted, or further subdivided into additional steps, and intervening steps may be applicable.

What is claimed is:

1. A method for forming a fine pattern in a semiconductor device, the method comprising:
    forming a first hard mask layer over a semiconductor substrate and a second hard mask layer over the first hard mask layer;
    selectively etching the second hard mask layer and the first hard mask layer by using a line/space mask as an etching mask to form a second hard mask layer pattern and a first hard mask layer pattern, wherein a line width of an upper part of the second hard mask layer pattern is narrower than that of its lower part;
    forming an insulating film filling the second hard mask layer pattern and the first hard mask layer pattern;
    selectively etching the second hard mask layer pattern and its underlying first hard mask layer pattern by using the insulating film as an etching mask to form a third hard mask layer pattern and an underlying fourth hard mask layer pattern;
    removing the insulating film and the third hard mask layer pattern; and
    patterning the semiconductor substrate by using the fourth hard mask layer pattern as an etching mask, to form a pattern.

2. The method of claim 1, wherein the forming of the second hard mask layer pattern and the first hard mask layer pattern comprises:

selectively etching the second hard mask layer and the first hard mask layer by using the line/space mask to form a fifth hard mask layer and the first hard mask layer pattern; and selectively etching the fifth hard mask layer pattern to form the second hard mask layer pattern, wherein the line width of an upper part of the second hard mask layer pattern is narrower than that of its lower part.

3. The method of claim 2, wherein the process of etching the second hard mask layer and the first hard mask layer comprises an anisotropic dry etching method.

4. The method of claim 2, wherein the process of etching the fifth hard mask layer pattern comprises an isotropic wet etching method.

5. The method of claim 1, wherein a ratio of the line width of the upper part of the second hard mask layer pattern to the width of the lower part is in a range of about 1.5:2.5 to about 0.5:3.5.

6. The method of claim 1, wherein a ratio of a line width of the upper part of the second hard mask layer pattern to the width of the lower part is substantially about 1:3.

7. The method of claim 1, further comprising forming a photoresist pattern over the second hard mask layer by using a line/space mask.

8. The method of claim 7, wherein a ratio of a line width of the photoresist pattern to the width of a space defined between the neighboring photoresist patterns is in a range of about 2.5:1.5 to about 3.5:0.5.

9. The method of claim 7, wherein a ratio of a line width of the photoresist pattern to the width of a space defined between the neighboring photoresist patterns is substantially about 3:1.

10. The method of claim 1, wherein the formation of the insulating film comprises:

forming the insulating film over the semiconductor substrate to fill up the second hard mask layer pattern and the first hard mask layer pattern; and etching the insulating film until the top surface of the second hard mask layer pattern is exposed.

11. The method of claim 10, wherein the process of etching the insulating film comprises an etch-back method using a gas including $O_2$.

12. The method of claim 1, wherein the insulating film is formed of a spin-on-carbon ("SOC") film.

13. The method of claim 1, wherein the process of selectively etching the second hard mask layer pattern and its underlying first hard mask layer pattern comprises an anisotropic dry etching method.

14. The method of claim 1, wherein the process of removing the insulating film and the fourth hard mask layer pattern comprises:

removing the insulating film; and then removing the fourth hard mask layer pattern.

15. The method of claim 14, wherein the process of removing the insulating film comprises a plasma etching method using a gas including $O_2$.

16. The method of claim 14, wherein the process of removing the fourth hard mask layer pattern comprises a wet etching method using a buffer oxide etchant ("BOE") solution.

17. The method of claim 1, wherein a ratio of line width of neighboring patterns to that the width of a space defined between the neighboring patterns is substantially about 1:1.

18. The method of claim 1, further comprising forming a buffer layer in the interface between the first hard mask layer and the semiconductor substrate.

19. The method of claim 18, wherein the buffer layer is formed of a SiON film to serve as an etch stop layer for a plasma etching method using a gas including $O_2$.

20. The method of claim 1, wherein the second hard mask layer is formed of a $SiO_2$ film.

21. The method of claim 1, wherein the first hard mask layer is formed of a polysilicon layer or a $Si_3N_4$ film.

22. A semiconductor device comprising patterns formed according to the method of claim 1.

* * * * *